(12) United States Patent
Hsieh et al.

(10) Patent No.: US 7,637,752 B2
(45) Date of Patent: Dec. 29, 2009

(54) BURN-IN-SOCKET HAVING SLIDER ARRANGMENTS

(75) Inventors: Wen-Yi Hsieh, Tu-cheng (TW); Ke-Hao Chen, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/156,288

(22) Filed: May 30, 2008

(65) Prior Publication Data

US 2008/0299810 A1    Dec. 4, 2008

(30) Foreign Application Priority Data

May 30, 2007    (CN)    ............ 2007 2 0039274

(51) Int. Cl.
*H01R 12/00* (2006.01)
(52) U.S. Cl. ............................................. 439/70
(58) Field of Classification Search ............ 439/70, 439/259, 330, 331
See application file for complete search history.

(56) References Cited

U.S. PATENT DOCUMENTS

| 6,162,066 | A   | 12/2000 | Glick et al. |
| 6,375,484 | B1* | 4/2002  | Shimada ............... 439/330 |
| 6,614,247 | B2  | 9/2003  | Ikeya et al. |
| 6,965,246 | B2* | 11/2005 | Gattuso et al. ......... 324/760 |

FOREIGN PATENT DOCUMENTS

| CN | 201041844 Y | 3/2008 |
| CN | 201054401 Y | 4/2008 |

\* cited by examiner

*Primary Examiner*—Phuong K Dinh
(74) *Attorney, Agent, or Firm*—Andrew C. Cheng; Wei Te Chung; Ming Shieh Chang

(57) ABSTRACT

A burn-in socket for receiving an IC package includes a base, a platform located within the base for loading the IC package, a number of contacts arranged in the base for connecting with the IC package, a cover movably mounted upon the base, and at least one slider arrangement actuated by the cover. The slider arrangement comprises a first rod pivotally connected to the cover, a slider capable of abutting against the IC package, and a second rod with one end pivotally connected to the first rod and the other end pivotally connected to the slider.

17 Claims, 6 Drawing Sheets

BURN-IN-SOCKET HAVING SLIDER ARRANGMENTS

BACKGROUND OF THE INVENTION

1. Field of the Invention

This invention relates generally to a burn-in socket for removably loading an IC package to make an electrical connection with contacts of the burn-in socket, and more particularly, to a burn-in socket having slider arrangements for keeping the IC package reliable.

2. Description of the Related Art

IC packages are usually subjected to pass a so-called burn-in test, in which the IC packages are placed in an oven and operated for a time at an elevated temperature, and under a voltage source that is greater than the rated value. Those IC packages that continue to perform satisfactorily are then approved for shipment. A burn-in socket is accordingly used to process such a burn-in test for an IC package. A conventional burn-in socket generally includes a base, a platform located within the base for loading the IC package, a number of contacts to be electrically connected with conductive leads of the IC package. A cover movably mounted upon the base is used to actuate some pressing elements to latch the IC package. The platform of the conventional burn-in socket is usually designed of bigger size than that of the IC package, so as to make it easy for loading the IC package. Accurate position and reliability of the IC package therefore become considerable problems to be solved. A conventional method is to provide a pushing finger to abut against the IC package. The pushing finger is actuated by interference friction with the movable cover. The pushing finger moves transversely toward the IC package when the cover moves downwardly toward the base. By the pushing finger, the IC package is able to be reliably kept on the platform.

However, it is noted that the friction between the pushing finger and the cover will speed up the abrasion of the pushing finger and therefore decrease the using life of the pushing finger. Another disadvantage of the conventional burn-in socket is that the travel distance of the pushing finger is short, which makes the burn-in socket only adapt for single type of IC packages having equal sizes.

BRIEF SUMMARY OF THE INVENTION

Accordingly, it is an object of the present invention to provide a burn-in socket without bringing abrasion.

It is another object of the present invention to provide a burn-in socket adapted for more than one IC packages having different sizes.

According to one aspect of the present invention, a burn-in socket for receiving an IC package is provided. The burn-in socket comprises a base, a platform located within the base for loading the IC package, a plurality of contacts arranged in the base for connecting with the IC package, a cover movably mounted upon the base, and at least one slider arrangement actuated by the cover. The slider arrangement comprises a first rod pivotally connected to the cover, a slider capable of abutting against the IC package, and a second rod with one end pivotally connecting to the first rod and the other end pivotally connected to the slider.

According to another aspect of the present invention, a burn-in socket for receiving an IC package is provided. The burn-in socket comprises a base, a platform located within the base for loading the IC package, a plurality of contacts arranged in the base for connecting with the IC package, a cover movably mounted upon the base, and at least one slider arrangement. The slider arrangement comprises a slider capable of sliding in a horizontal direction and abutting against the IC package. The slider is pivotally connected to a linking element which is actuated by the cover directly or indirectly.

Other objects, advantages and novel features of the present invention will become more apparent from the following detailed description of the present embodiment when taken in conjunction with the accompanying drawings.

BRIEF DESCRIC PACKAGETION OF THE DRAWINGS

DETAILED DESCRIC PACKAGETION OF THE INVENTION

Figure 1:
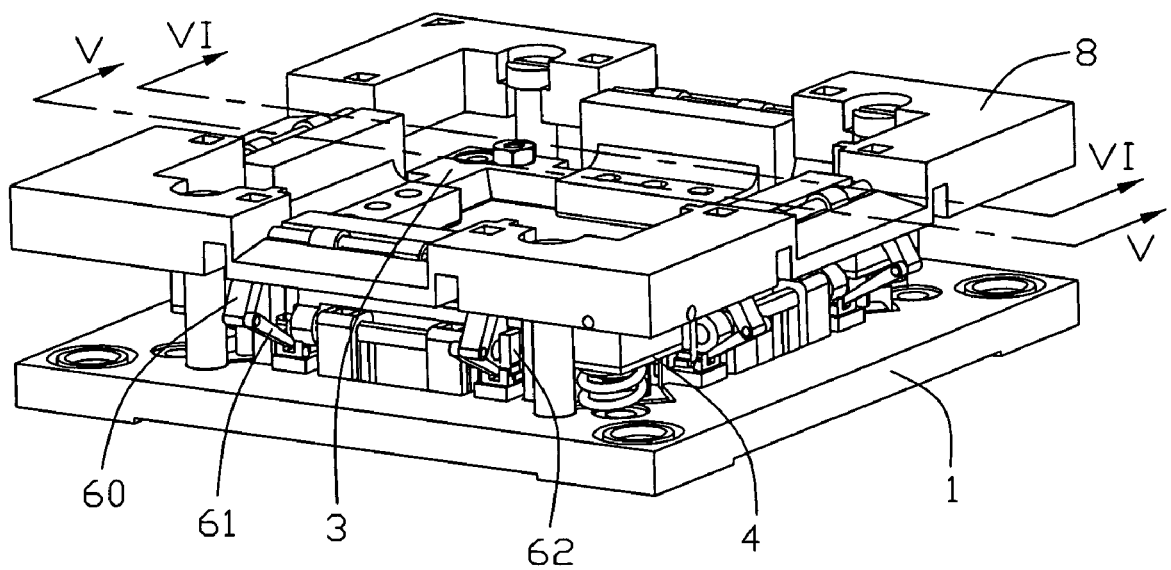
FIG. 1 is an assembled, perspective view of a burn-in socket according to an embodiment of the present invention.
Figure 2:
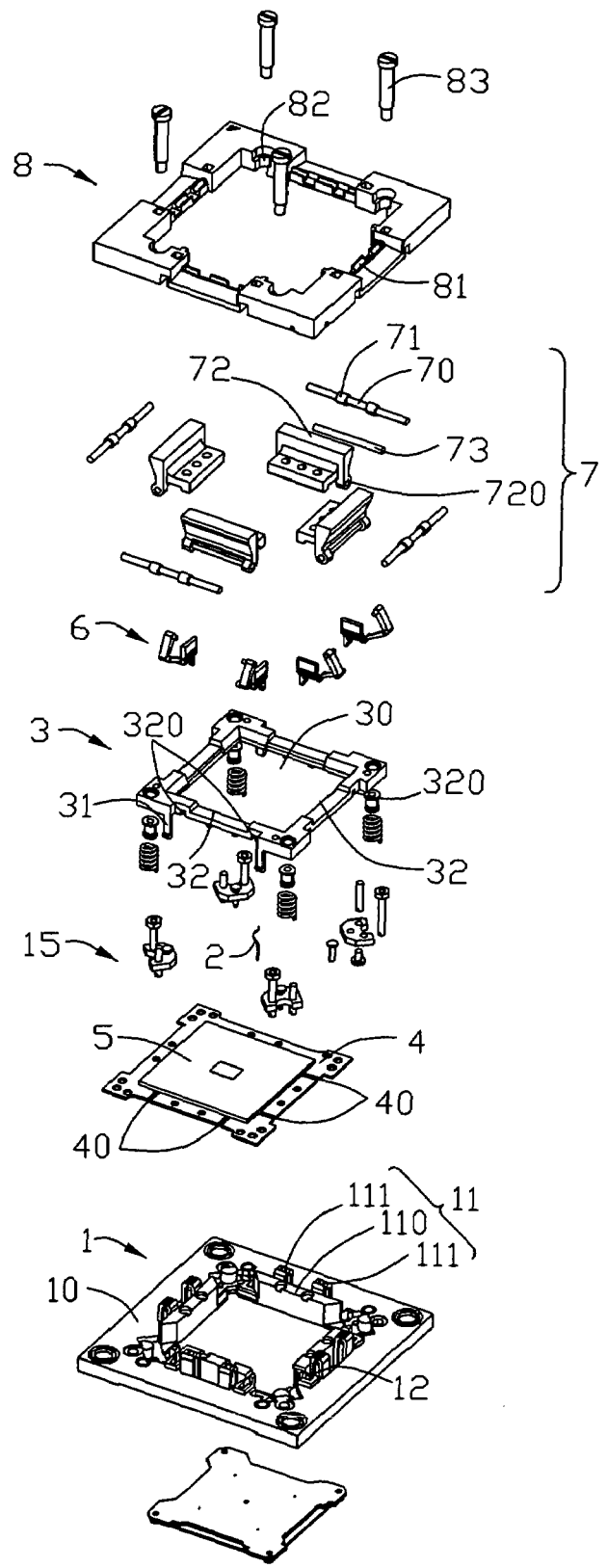
FIG. 2 is an exploded, perspective view of the burn-in socket.

Following is the description of the best embodiment of the burn-in socket 100 of present invention. Referring to FIG. 1 and FIG. 2, the burn-in socket 100 includes a rectangular base 1 with a frame configuration, a platform 4 located within the base 1, an alignment frame 3 mounted above the platform 4, and a cover 8 movably mounted upon the base 1 to actuate four pressing elements 7 which is to latch an IC package 5 to be reliably kept on the platform 4. A plurality of contacts 2 are arranged in the base 1 for connecting with the IC package 5.

Figure 3:
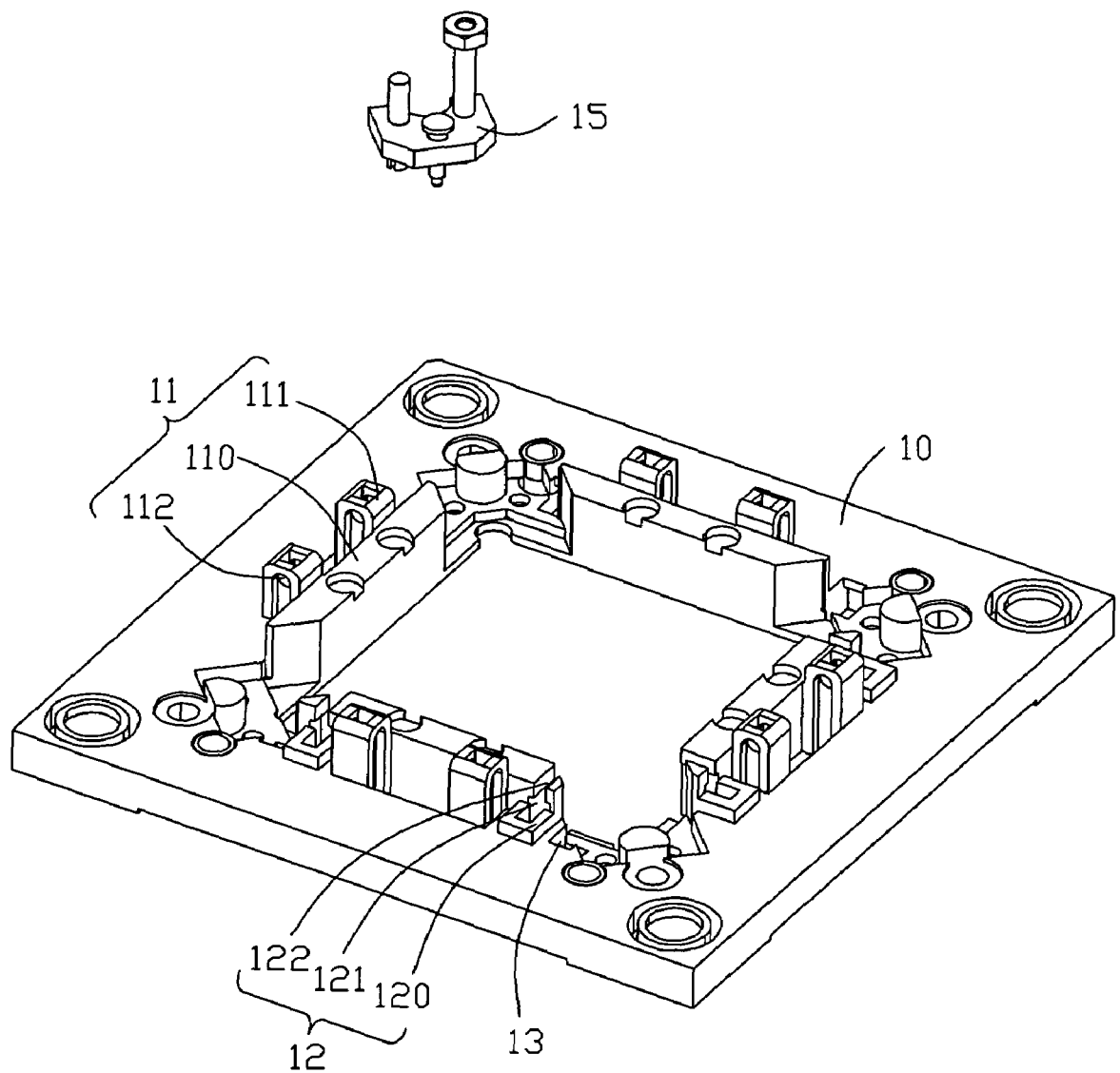
FIG. 3 is a perspective view of a base according to the embodiment of the present invention.
Figure 4:
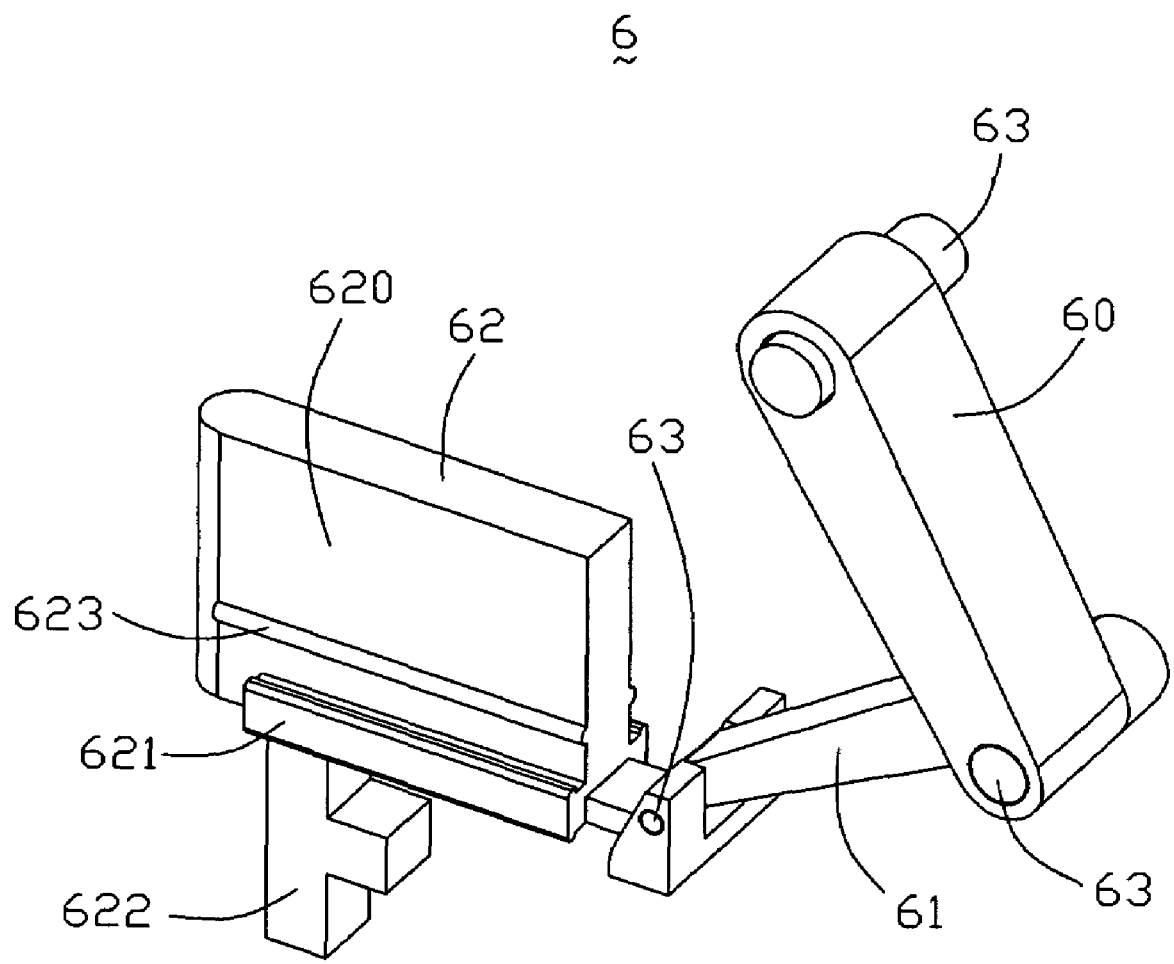
FIG. 4 is a perspective view of a slider arrangement according to the embodiment of the present invention.
Figure 5:
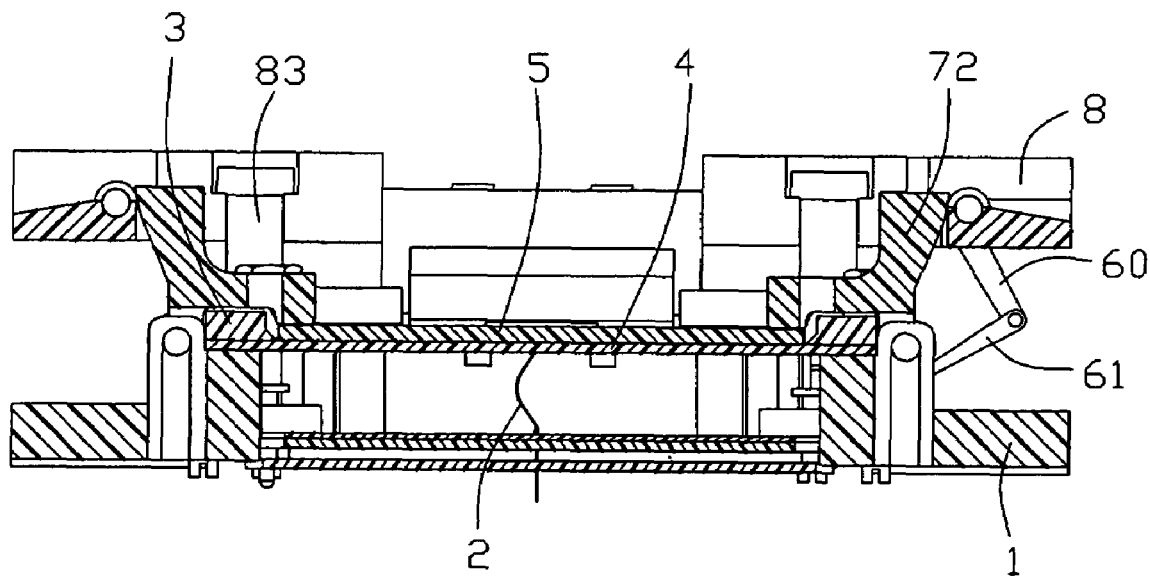
FIG. 5 is a cross-sectional view taken along a line V-V in FIG. 1.
Figure 6:
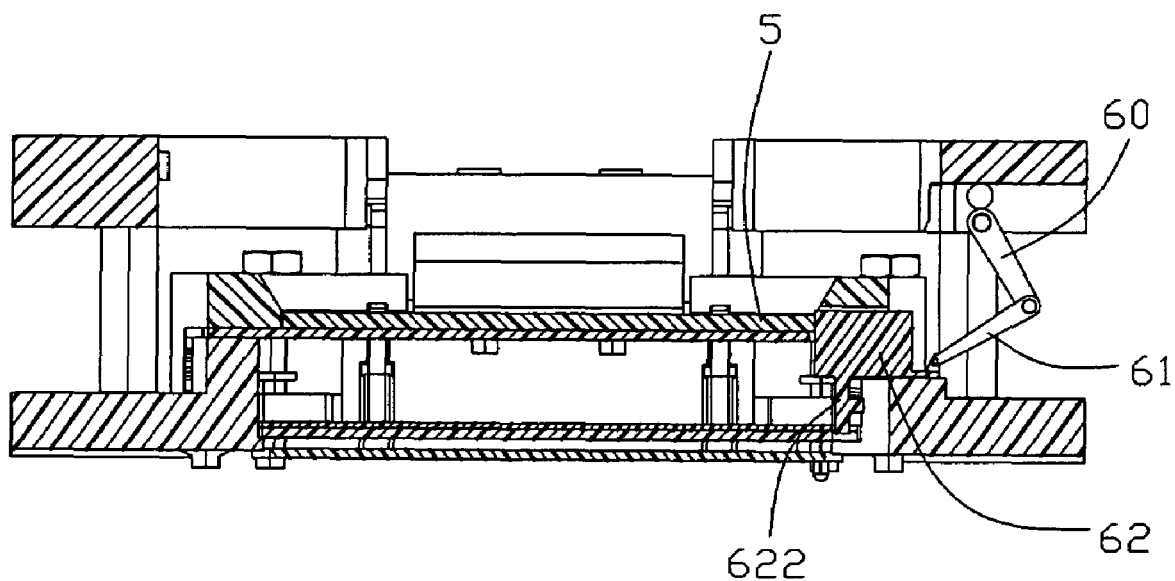
FIG. 6 is a cross-sectional view taken along a line VI-VI in FIG. 1.

Referring to FIG. 2 and FIG. 3, the base 1 includes a body 10 having four sides, each of which has an assembling portion 11 formed thereon. The assembling portion 11 includes a vertical wall 110, and a pair of supporting portions 111 behind the vertical wall 110. Each supporting portion 111 has a connecting hole 112. A pair of receiving portions 12 are further formed respectively at the lateral sides of the vertical wall 110. The receiving portion 12 includes a bottom portion 120, a wide slot 121 and a narrow slot 122. Four fixing devices 15 are used to assemble the burn-in socket 100.

The cover 8 is able to move in an up-down direction, and actuate four pressing elements 7 to latch the IC package 5. The pressing element 7 includes a first shaft 70, a second shaft 73 and a pressing body 72. The first shaft 70 is fixed at a top end of the pressing body by insertion into a pair of rings 71, which are capable of being made integrally with the pressing body 72. The second shaft 73 is fixed at a bottom end of the pressing body 72 by insertion into a pair of axial holes 720. Each side of the cover 8 has one axial trough 81 for receiving one first shaft 70 of the pressing element 7. The second shaft 73 is received in the connecting hole 112 of the supporting portion 111 on the base 1. Besides, the cover 8 has four holes 82 at the corners to receive four screws 83, so as to mount the cover 8 upon the base 1.

The alignment frame 3 defines an opening 30 for aligning the IC package 5, which has a smaller size than that of the opening 30. Four legs 31 are extending downwardly at four corners of the alignment frame 3 and each leg 31 is inserted into one slot 13 formed on the base 1. Two adjacent sides 32 of the alignment frame 3 are respectively formed with two notches 320. The platform 4 is located within the base 1 and under the alignment frame 3. Two adjacent edges of the platform 4 are respectively formed with two notches 40, which are respectively corresponding to the notches 320 in the alignment frame 3.

Referring FIG. 2 to FIG. 6, four slider arrangements 6 are provided at two adjacent sides of base 1 to abut against the IC package 5 and keep the IC package 5 in a steady position. The slider arrangement 6 includes a first rod 60 pivotally connected to the cover 8, a slider 62 for abutting against the IC package 5, and a second rod 61 with one end pivotally connected to the first rod 60 and the other end pivotally connected to the slider 62. All above pivotal connection are completed by rotating shafts 63. The slider 62 is received in the receiving portion 12 of the base 1, and is able to slide in the receiving portion 12 in a horizontal direction. The slider 62 includes a pushing portion 620, a track portion 621 at the bottom of the pushing portion 620 and a leg portion 622 under the track portion 621. The pushing portion 620 slides in the narrow slot 122 of the receiving portion 12 and extends into the notch 40 of the platform 4 and the notch 320 of the alignment frame 3. The track portion 621 locates above the bottom portion 120 and slides in the wide slot 121 of the receiving portion 12. The pushing portion 620 further has a pair of ribs 623 respectively positioned on lateral sides thereof to decrease friction between the slider 62 and the plastic material of the receiving portion 12.

The cover 8 moves downwardly when an operation force is applied on it, and actuates the pressing elements 7 into open positions to allow the IC package 5 to be loaded. Simultaneously, the cover 8 actuates the slider arrangements 6. The angle between the first rod 60 and the second rod 61 gets smaller gradually as a top end of the first rod 60 moves downwardly, which pull the second rod 61 backwardly and synchronously pull the slider 62 outwardly. The IC package 5 is able to be loaded on the platform 4 when the cover 8 is pressed to a down-most position. When the operation force exerted on the cover 8 is released, the pressing elements 7 get to closed positions by special spring elements (not shown), and reversely push the cover 8 to its original position. The angle between the first rod 60 and the second rod 61 gets bigger gradually as the top end of the first rod 60 moves upwardly, which simultaneously push the second rod 61 forwardly and synchronously push the slider 62 forwardly. Then the pushing portion 620 of slider 62 abuts against the IC package 5, which is just pressed by the pressing elements 7. Therefore, the IC package is reliably kept both in a horizontal direction and a vertical direction.

Because the first rod 60 is pivotally connected to the cover 8, and the slider 62 is pivotally connected to the second rod 61, no friction between the cover 8 and the slider arrangements 6 is generated during the sliding action of the slider arrangements 6. So the using life of the slider arrangement 6 is extended, and fine performance can be kept for a long time. Further, the travel distance of the slider 62 is refined to a high value, which makes the burn-in socket 100 adapt for more IC packages of different sizes.

What is claimed is:

1. A burn-in socket for receiving an IC package comprising:
   a base;
   a platform located within the base for loading and supporting the IC package from below;
   a plurality of contacts arranged in the base for connecting with the IC package;
   a cover movably mounted upon the base; and
   at least one slider arrangement actuated by the cover, the slider arrangement comprising a first rod pivotally connected to the cover, a slider capable of abutting against the IC package, and a second rod with one end pivotally connected to the first rod and the other end pivotally connected the slider, wherein at least two slider arrangements are provided, which respectively locating at two adjacent sides of the base and are used to laterally position the IC on the platform.

2. The burn-in socket according to claim 1, wherein the base has at least one receiving portion to receive the slider.

3. The burn-in socket according to claim 2, wherein the receiving portion has a wide slot and a narrow slot.

4. The burn-in socket according to claim 3, wherein the slider has a pushing portion capable of sliding in the narrow slot, and a track portion capable of sliding in the wide slot.

5. The burn-in socket according to claim 1, wherein the slider has at least one rib at one lateral side thereof to decrease friction.

6. The burn-in socket according to claim 1, wherein the platform has at least one notch at one edge thereof, and the slider being able to extend into the notch.

7. The burn-in socket according to claim 1, further comprising an alignment frame above the platform and defining an opening for the IC package.

8. The burn-in socket according to claim 7, wherein the alignment frame has at least one notch at one side thereof, and the slider being able to extend into the notch.

9. The burn-in socket according to claim 1, at least one pressing element is provided to latch the IC package.

10. A burn-in socket for receiving an IC package comprising:
    a base;
    a platform located within the base for loading and supporting the IC package from below;
    a plurality of contacts arranged in the base for connecting with the IC package;
    a cover movably mounted upon the base; and
    at least one slider arrangement comprising a slider capable of sliding in a horizontal direction and abutting against the IC package, the slider being pivotally connected to a linking element which is actuated by the cover directly or indirectly wherein the slider arrangement further has a first rod pivotally connected to the cover and a second rod pivotally connected to the first rod, said linking element in the second rod, wherein at least two slider arrangements are provided, which respectively locating at two adjacent sides of the base and are used to laterally position the IC on the platform.

11. The burn-in socket according to claim 10, wherein the base has at least one receiving portion to receive the slider, the receiving portion having a wide slot and a narrow slot.

12. The burn-in socket according to claim 11, wherein the slider has a pushing portion capable of sliding in the narrow slot, and a track portion capable of sliding in the wide slot.

13. The burn-in socket according to claim 10, wherein the slider has at least one rib at one lateral side thereof to decrease friction.

14. The burn-in socket according to claim 10, further comprising an alignment frame above the platform and defining an opening for the IC package.

15. The burn-in socket according to claim 10, at least one pressing element is provided to latch the IC package.

16. The burn-in socket comprising:

a base;

a cover up and down moveable with regard to the base by means of a plurality of biasing devices;

a slider moveable in at least a horizontal direction for inward engagement with an IC package received in the base; and at least two bar linkage structure including a first bar with one end pivotally linked to the slider, and a second bar with one end pivotally connected to the other end of the first bar and with the other end up and down moveable with regard to the base corresponding to up-and-down movement of the cover with regard to the base;

a pressing element pivotally moveable with regard to the base corresponding to the up-and-down movement of cover with regard to the base; wherein when the cover is moved to an uppermost position with regard to the base, the presses element downwardly presses IC package, and the slider laterally and sideward and inwardly presses IC package.

17. The burn-in socket as claimed in claim 16, wherein the end of the first bar is essentially only moved in a horizontal direction while the other end of the second bar is essentially moved in a vertical direction.

\* \* \* \* \*